United States Patent
Maeda et al.

(10) Patent No.: US 7,235,128 B2
(45) Date of Patent: Jun. 26, 2007

(54) PROCESS FOR PRODUCING SINGLE-CRYSTAL SEMICONDUCTOR AND APPARATUS FOR PRODUCING SINGLE-CRYSTAL SEMICONDUCTOR

(75) Inventors: Susumu Maeda, Hiratsuka (JP); Hiroshi Inagaki, Hiratsuka (JP); Shigeki Kawashima, Hiratsuka (JP); Shoei Kurosaka, Hiratsuka (JP); Kozo Nakamura, Hiratsuka (JP)

(73) Assignee: Komatsu Denshi Kinzoku Kabushiki Kaisha, Kanagawa (JP)

( * ) Notice: Subject to any disclaimer, the term of this patent is extended or adjusted under 35 U.S.C. 154(b) by 106 days.

(21) Appl. No.: 11/005,180

(22) Filed: Dec. 6, 2004

(65) Prior Publication Data

US 2005/0139149 A1  Jun. 30, 2005

(51) Int. Cl.
C30B 15/20 (2006.01)

(52) U.S. Cl. .......................... 117/13; 117/14; 117/201; 117/900

(58) Field of Classification Search .................. 117/13, 117/14, 201, 900
See application file for complete search history.

(56) References Cited

U.S. PATENT DOCUMENTS 5,785,758 A * 7/1998 Yamagishi et al. ......... 117/200
6,042,644 A * 3/2000 Kurosaka et al. ............. 117/13
6,042,646 A * 3/2000 Ishikawa et al. ............. 117/14

FOREIGN PATENT DOCUMENTS

| JP | 05294783 | 11/1993 |
|----|----------|---------|
| JP | 11-189488 | 7/1999 |
| JP | 11-302096 | 11/1999 |
| JP | 2001-106593 | 4/2001 |
| WO | WO 97/32059 | 9/1997 |

* cited by examiner

Primary Examiner—Felisa Hiteshew
(74) Attorney, Agent, or Firm—Welsh & Katz, Ltd

(57) ABSTRACT

A process for producing a single-crystal semiconductor and an apparatus therefor. A single-crystal semiconductor of large diameter and large weight can be lifted with the use of existing equipment not having any substantial change thereto while not influencing the oxygen concentration of single-crystal semiconductor and the temperature of melt and while not unduly raising the temperature of seed crystal. In particular, the relationship (L1, L2, L3) between the allowable temperature difference (ΔT) and the diameter (D) of seed crystal (14) is preset so that the temperature difference between the seed crystal (14) at the time the seed crystal (14) is immersed in the melt and the melt (5) falls within the allowable temperature difference (ΔT) at which dislocations are not introduced into the seed crystal (14). In accordance with the relationship (L1, L2, L3), the allowable temperature difference (ΔT) corresponding to the diameter (D) of seed crystal (14) to be immersed in the melt is determined. Temperature control is conducted so that at the time the seed crystal (14) is immersed in the melt (5) the temperature difference between the seed crystal (14) and the melt (5) falls within the determined allowable temperature difference (ΔT).

10 Claims, 6 Drawing Sheets

4 PULLING MECHANISM
4a PULLING SHAFT
7 ARGON GAS
8 HEAT SHIELDING PLATE
10 ROTATING SHAFT
11 GRAPHITE CRUCIBLE
13 THERMAL INSULATOR

- 4 PULLING MECHANISM
- 4a PULLING SHAFT
- 7 ARGON GAS
- 8 HEAT SHIELDING PLATE
- 10 ROTATING SHAFT
- 11 GRAPHITE CRUCIBLE
- 13 THERMAL INSULATOR

4  PULLING MECHANISM
4a PULLING SHAFT
7  ARGON GAS
8  HEAT SHIELDING PLATE
10 ROTATING SHAFT
11 GRAPHITE CRUCIBLE
13 THERMAL INSULATOR

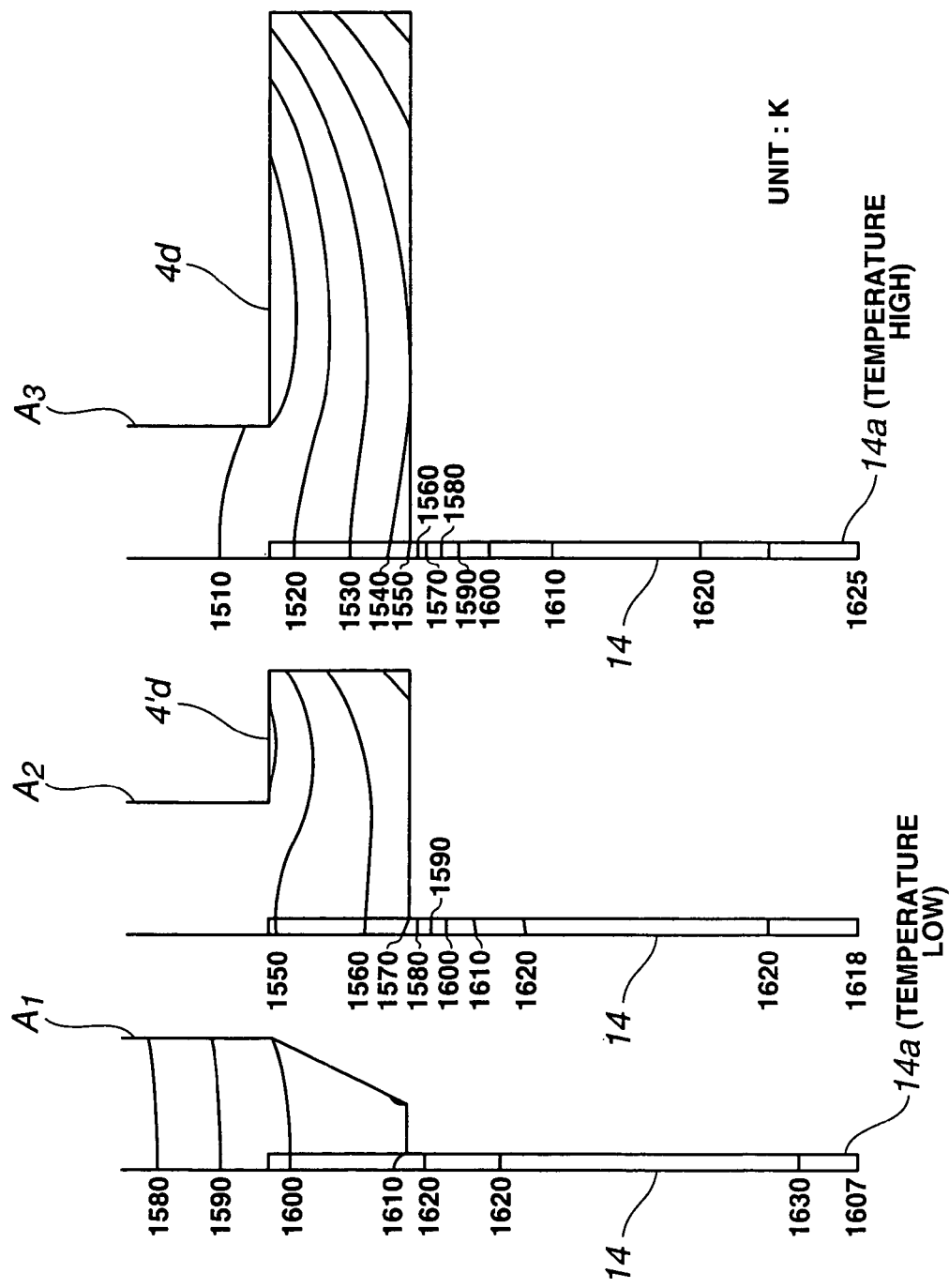

PROCESS FOR PRODUCING SINGLE-CRYSTAL SEMICONDUCTOR AND APPARATUS FOR PRODUCING SINGLE-CRYSTAL SEMICONDUCTOR

TECHNICAL FIELD

The present invention relates to a process and apparatus capable of producing a large-diameter and heavy single-crystal semiconductor without dislocations when a CZ method (Czochralski method) is used to produce a single-crystal semiconductor such as single crystal silicon.

BACKGROUND ART

Methods for producing single crystal silicon include the CZ method.

FIG. 1 shows an example structure of a single crystal pulling apparatus 1 using the CZ method.

A quartz crucible 3 of which outside is covered with a graphite crucible 11 is disposed in a single crystal pulling vessel 2 or a CZ furnace 2. Polycrystalline silicon (Si) is heated to melt in the quartz crucible 3. After melting is stabilized, a pulling mechanism 4 operates to pull a single crystal silicon (single crystal silicon ingot) 6 from melt 5. Specifically, a pulling shaft 4a is lowered, and a seed crystal 14 held by a seed chuck 4c at a leading end of the pulling shaft 4a is immersed in the melt 5. After the seed crystal 14 is adapted to the melt 5, the pulling shaft 4a is lifted. The single crystal silicon 6 grows as the seed crystal 14 held by the seed chuck 4c is pulled up. The quartz crucible 3 is rotated by a rotating shaft 10 while pulling up. The pulling shaft 4a of the pulling mechanism 4 rotates in an opposite direction or the same direction to the rotating shaft 10.

Various vaporized materials are produced within the vessel 2 during the single crystal pulling process (1 batch). Then, argon (Ar) gas 7 is supplied to the single crystal pulling vessel 2 and discharged together with the vaporized materials out of the vessel 2 to remove the vaporized materials from and clean the vessel 2. A supply flow rate of the argon gas 7 is determined for each process of the single batch.

A heat shielding plate 8 (gas rectifying column) is disposed above the quartz crucible 3 and around the single crystal silicon 6 to rectify the gas 7 in the single crystal pulling vessel 2, to guide to a surface 5a of the melt 5 and to shield the single crystal silicon 6 from a heat source. A distance (gap) G between the bottom end of the heat shielding plate 8 and the melt surface 5a is determined appropriately.

One of problems unavoidable when the single crystal silicon 6 is grown by the CZ method is a "dislocation" generated in the seed crystal at the time the seed crystal is immersed in the melt. The dislocation is induced because of a thermal stress caused in the seed crystal 14 when the seed crystal 14 is immersed in the melt 5. If the dislocation is continuously propagated through a necking portion formed at a lower portion of the seed crystal 14 and taken into the single crystal silicon 6 which is produced with the necking portion increased, this single crystal silicon 6 cannot be used for a semiconductor device. Therefore, it is necessary to eliminate the dislocation.

Accordingly, it is general that a necking process for gradually contracting the necking portion to a diameter of about 3 to 5 mm is conducted in the first step of the pulling process in order to remove the dislocation, which is introduced into the seed crystal 14 at the time the seed crystal is immersed in the melt, out of the seed crystal 14 after the seed crystal 14 is immersed in the melt 5.

In recent years, however, the production of a large-diameter silicon wafer having a diameter of 300 mm or more is being demanded, and a large-diameter and heavy single crystal silicon ingot is required to be pulled up without involving any problem. When a diameter of the necking portion is contracted to about 3 to 5 mm by the necking process, the dislocation is eliminated, but the diameter is excessively small, so that the large-diameter and heavy single crystal silicon ingot may not be produced without involving a problem that the crystal drops, or the like.

Here, an auxiliary holding device may be disposed to hold and pull the single crystal silicon 6 to prevent the single crystal silicon ingot from dropping due to breakage of the necking portion.

But, the addition of such an auxiliary holding device to the existing single crystal pulling apparatus 1 involves the increase of the number of parts and increases the apparatus cost. It is also presumed that technical difficulties are involved because a technique of securely holding the single crystal silicon 6 has not been established. Besides, when the mechanical holding device is disposed, a contaminant such as metal powder may be introduced into the CZ furnace 2, and the interior of the CZ furnace 2 might not be assured to have a clean environment.

Therefore, it is not desirable to dispose an auxiliary holding device to pull up the large-diameter and heavy single crystal silicon ingot.

Japanese Patent Application Laid-Open No. 11-189488 discloses the following technology that a large-diameter and heavy single crystal silicon ingot can be pulled up without reducing the necking portion.

a) The distance (gap) G between the bottom end of the heat shielding plate 8 and the melt surface 5a is increased to add radiant heat from the heater for heating the melt 5 in the quartz crucible 3 in a large amount to the seed crystal 14 so to raise the temperature of the seed crystal 14, thereby reducing a temperature difference between the seed crystal 14 and the melt 5 and reducing dislocations introduced into seed crystal 14 by a thermal stress.

b) A slit is formed in the graphite crucible 11 to add radiant heat from the heater for heating the melt 5 in the quartz crucible 3 in a large amount to the seed crystal 14 so to raise the temperature of the seed crystal 14, thereby reducing the temperature difference between the seed crystal 14 and the melt 5 and reducing dislocations introduced into the seed crystal 14 by a thermal stress.

c) An auxiliary heating device which is vertically movable by a moving mechanism is disposed, the auxiliary heating device is disposed on the side of the seed crystal 14 in the necking process to heat the seed crystal 14 so to raise its temperature to 1380° C. to 1480° C., thereby reducing the temperature difference between the seed crystal 14 and the melt 5 and reducing dislocations introduced into the seed crystal 14 by a thermal stress. As a test result, the necking portion was not broken when the seed crystal 14 had a diameter of 8 mm or 14 mm.

It is seen from the above a) and b) that it is advisable to raise the temperature of the seed crystal 14, but there is no suggestion about a quantitative value to which the temperature of the seed crystal 14 must be raised.

According to the above-described c), the seed crystal 14 is raised to the temperatures of 1380° C. to 1480° C., but if the seed crystal 14 is raised to such a high temperature, the seed crystal 14 might melt before it is immersed in the melt 5, and the diameter of the seed crystal 14 before it is immersed in the melt might be contracted. There is also a possibility that the leading end of the melted seed crystal drops to the melt 5 to change a dopant concentration in the melt 5, and a target crystal resistivity might be deviated. Besides, when the temperature is raised to such a high level, the quartz crucible may be deformed, and the crystal might be deformed while it is being pulled, and a possibility that dislocations are introduced into the crystal becomes high. In other words, 1380° C. to 1480° C. to which the temperature of the seed crystal 14 is raised are values of over-specification in eliminating the dislocations.

Besides, it is seen from the above-described c) that the necking portion is not broken when the seed crystal 14 having the diameter of 8 mm or 14 mm is raised to the temperatures of 1380° C. to 1480° C., but a critical relationship between the diameter of the seed crystal 14 and the temperature of the seed crystal 14 that the necking portion is not broken is not shown clearly.

According to the above-described a), increase of the gap distance G between the bottom end of the heat shielding plate 8 and the melt surface 5a is effective, however, this distance G is a parameter limiting an amount of oxygen vaporizing from the melt surface 5a, and the oxygen concentration taken into the single crystal silicon 6 is influenced depending on the size of the gap G. Therefore, the dislocations introduced into the single crystal silicon 6 when the gap G is increased in size can be eliminated, but the oxygen concentration in the single crystal silicon 6 is also influenced, possibly affecting significantly on the characteristics of an element or a device. When the size of the gap G is changed, the temperature of the melt 5 is also affected. Therefore, it is not desirable to adopt a technique of adjusting the gap G.

According to the above-described b), when the slit is formed in the graphite crucible 11, the temperature of the melt 5 might be raised. Therefore, it is not desirable to adopt the technique of forming the slit in the graphite crucible 11.

According to the above-described c), the addition of the moving mechanism and the auxiliary heating device to the existing single crystal pulling apparatus 1 increases the number of parts and increases the apparatus cost. Therefore, it is not desirable to adopt the technique of disposing such new moving mechanism and auxiliary heating device to heat merely the seed crystal 14.

SUMMARY OF THE INVENTION

Accordingly, it is an object of the present invention to pull a large-diameter and heavy single-crystal semiconductor without making a substantial change to an existing apparatus, without influencing on an oxygen concentration of the single-crystal semiconductor or a temperature of the melt and without raising the temperature of the seed crystal more than necessary.

A first invention is a process for producing a single-crystal semiconductor by immersing a seed crystal in a melt and pulling the seed crystal, comprising:

previously setting a relationship between an allowable temperature difference and a diameter of the seed crystal so that a temperature difference between the seed crystal and the melt at the time the seed crystal is immersed in the melt falls within the allowable temperature difference at which dislocations are not introduced into the seed crystal;

determining the allowable temperature difference corresponding to the diameter of the seed crystal to be immersed in the melt according to the relationship; and adjusting a temperature so that the temperature difference between the seed crystal and the melt falls within the determined allowable temperature difference at the time the seed crystal is immersed in the melt.

According to the first invention, the relationship L1, L2, L3 between the allowable temperature difference ΔT and the diameter D of the seed crystal 14 is preset so that the temperature difference between the seed crystal 14 and the melt 5 at the time the seed crystal is immersed in the melt falls within the allowable temperature difference ΔT at which dislocations are not introduced into the seed crystal 14 as shown in FIG. 5.

And, the allowable temperature difference ΔT corresponding to the diameter D of the seed crystal 14 to be immersed in the melt is determined according to the relationships L1, L2, L3.

At the time the seed crystal 14 is immersed in the melt 5, the temperature is adjusted so that the temperature difference between the seed crystal 14 and the melt 5 falls within the determined allowable temperature difference ΔT.

According to the first invention, because critical numerical values of the allowable temperature difference ΔT for avoiding the introduction of the dislocations into the seed crystal 14 are clearly determined as the relationships L1, L2, L3, the introduction of the dislocations into the seed crystal 14 can be prevented without decreasing the allowable temperature difference ΔT more than necessary, namely without raising the temperature of the seed crystal 14 more than necessary. Therefore, the seed crystal 14 can be prevented from melting before it is immersed in the melt 5. And, a heat load on the quartz crucible 3 can be reduced.

A second invention is a process for producing a single-crystal semiconductor by immersing a seed crystal having an impurity added therein in a melt and pulling the seed crystal, comprising:

previously setting a relationship among an allowable temperature difference, a diameter of the seed crystal and a concentration of the impurity in the seed crystal so that a temperature difference between the seed crystal and the melt at the time the seed crystal is immersed in the melt falls within the allowable temperature difference at which dislocations are not introduced into the seed crystal;

determining the allowable temperature difference corresponding to the diameter of the seed crystal to be immersed in the melt and the concentration of the impurity in the seed crystal according to the relationship; and adjusting a temperature so that the temperature difference between the seed crystal and the melt falls within the determined allowable temperature difference at the time the seed crystal is immersed in the melt.

According to the second invention, the relationships L1, L2, L3 among the allowable temperature difference ΔT, the diameter D of the seed crystal 14 and the impurity concentration C in the seed crystal 14 are preset so that the temperature difference between the seed crystal 14 and the melt 5 at the time the seed crystal is immersed in the melt becomes the allowable temperature difference ΔT at which dislocations are not introduced into the seed crystal 14 as shown in FIG. 5. If the diameter D of the seed crystal 14 is same, the relationship changes as indicated by L1, L2, L3 according to increase in the impurity concentration C as C1, C2, C3, and the allowable temperature difference ΔT becomes large.

According to the relationships L1, L2, L3, the allowable temperature difference ΔT corresponding to the diameter D of the seed crystal 14 to be immersed in the melt and the impurity concentration C in the seed crystal 14 is determined.

And, a temperature is adjusted so that at the time the seed crystal 14 is immersed in the melt 5 the temperature difference between the seed crystal 14 and the melt 5 falls within the determined allowable temperature difference ΔT.

According to the second invention, the critical numerical values of the allowable temperature difference ΔT for avoiding the introduction of the dislocations into the seed crystal 14 are clearly determined as the relationships L1, L2, L3, so that the introduction of the dislocations into the seed crystal 14 can be prevented without decreasing the allowable temperature difference ΔT more than necessary, namely without increasing the temperature of the seed crystal 14 more than necessary. Besides, a heat load on the quartz crucible 3 can be reduced. Therefore, the seed crystal 14 can be prevented from melting before it is immersed in the melt 5. According to the second invention, if the diameter D of the seed crystal 14 is same, the allowable temperature difference ΔT can be increased by increasing the concentration of the impurity (e.g., boron B) in the seed crystal 14. Therefore, the introduction of the dislocations can be prevented while the rise of the temperature of the seed crystal 14 is suppressed to a smaller level.

A third invention is a process for producing a single-crystal semiconductor by immersing a seed crystal having an impurity added therein in a melt and pulling the seed crystal, comprising:

previously setting a relationship among an allowable temperature difference, a diameter of the seed crystal and a concentration of the impurity in the seed crystal so that a temperature difference between the seed crystal and the melt at the time the seed crystal is immersed in the melt falls within the allowable temperature difference at which dislocations are not introduced into the seed crystal;

determining a concentration of the impurity according to the diameter of the seed crystal to be immersed in the melt and the temperature difference between the seed crystal and the melt at the time the seed crystal is immersed in the melt according to the relationship; and adjusting the concentration of the impurity in the seed crystal so that the concentration of the impurity in the seed crystal falls not less than the determined concentration of the impurity.

According to the third invention, the relationships L1, L2, L3 among the allowable temperature difference ΔT, the diameter D of the seed crystal 14 and the impurity concentration C in the seed crystal 14 are preset so that the temperature difference between the seed crystal 14 and the melt 5 at the time the seed crystal is immersed in the melt falls within allowable temperature difference ΔT at which the dislocations are not introduced into the seed crystal 14 as shown in FIG. 5. If the allowable temperature difference ΔT is same, the relationship changes as indicated by L1, L2, L3 as the diameter D of the seed crystal 14 increases as indicated by D1, D2, D3, and the impurity concentration C increases as indicated by C1, C2, C3.

And, according to the relationships L1, L2, L3, the diameter D3 of the seed crystal 14 to be immersed in the melt, and the impurity concentration C3 corresponding to the temperature difference ΔT0 between the seed crystal 14 and the melt 5 at the time the seed crystal is immersed in the melt are determined.

And, the impurity concentration C in the seed crystal 14 is adjusted so that the impurity concentration C in the seed crystal 14 falls not less than the determined impurity concentration C3.

According to the third invention, if the allowable temperature difference ΔT is same, the diameter D of the seed crystal 14 is increased by increasing the impurity concentration C in the seed crystal 14, so that the introduction of the dislocations can be prevented and a large-diameter and heavy single-crystal semiconductor can be pulled up by adjusting the impurity concentration C without controlling the temperature difference ΔT between the seed crystal 14 and the melt 5, namely the temperature of the seed crystal 14.

A fourth invention is in accordance with the first invention, the second invention or the third invention, wherein the single-crystal semiconductor is grown without performing a necking process for gradually reducing the diameter of the single-crystal semiconductor, after the seed crystal is immersed in the melt.

According to the fourth invention, the introduction of the dislocations can be prevented without reducing the seed crystal 14 to be smaller than the diameter D shown in FIG. 5, so that a necking process is not necessary. Therefore, the production time of the single crystal silicon ingot 6 is decreased, and a strength capable of holding the large-diameter and heavy silicon single crystal is maintained by the necking portion only.

A fifth invention is an apparatus for producing a single-crystal semiconductor by heating a melt in a crucible, immersing a seed crystal in the melt and pulling the seed crystal, comprising:

a plurality of heating units which are disposed outside of the crucible to adjust independently an amount of heat applied to the crucible, wherein:

a relationship between an allowable temperature difference and a diameter of the seed crystal is previously determined so that a temperature difference between the seed crystal and the melt at the time the seed crystal is immersed in the melt falls within the allowable temperature difference at which dislocations are not introduced into the seed crystal;

the allowable temperature difference corresponding to the diameter of the seed crystal to be immersed in the melt is determined according to the relationship; and individual amounts of heat applied by the plurality of heating units are controlled at the time the seed crystal is immersed in the melt so that the temperature difference between the seed crystal and the melt falls within the determined allowable temperature difference.

A sixth invention is an apparatus for producing a single-crystal semiconductor by heating a melt in a crucible, immersing a seed crystal having an impurity added therein in the melt, and pulling the seed crystal, comprising:

a plurality of heating units which are disposed outside of the crucible to adjust independently an amount of heat applied to the crucible, wherein:

a relationship among an allowable temperature difference, a diameter of the seed crystal and a concentration of the impurity in the seed crystal is previously determined so that a temperature difference between the seed crystal and the melt at the time the seed crystal is immersed in the melt falls within the allowable temperature difference at which dislocations are not introduced into the seed crystal;

the allowable temperature difference corresponding to the diameter of the seed crystal to be immersed in the melt and the concentration of the impurity in the seed crystal is determined according to the relationship; and individual amounts of heat applied by the plurality of heating units are controlled at the time the seed crystal is immersed in the melt so that the temperature difference between the seed crystal and the melt falls within the determined allowable temperature difference.

A seventh invention is in accordance with the fifth invention or the sixth invention, wherein the plural heating units are heating units which are disposed vertically at individual positions outside of the crucible, and the temperature difference between the seed crystal and the melt at the time the seed crystal is immersed in the melt is set to the allowable temperature difference or below by decreasing or turning off an output of a heating unit disposed at a lower side.

According to the fifth invention, it is controlled according to the relationships L1, L2, L3 shown in FIG. 5 in the same way as in the first invention so that the temperature difference between the seed crystal 14 and the melt 5 falls within the allowable temperature difference ΔT, so that the introduction of the dislocations into the seed crystal 14 can be prevented without raising the temperature of the seed crystal 14 more than necessary, and the seed crystal 14 can be prevented from melting before it is immersed in the melt 5.

According to the sixth invention, the temperature difference between the seed crystal 14 and the melt 5 is controlled to fall within the allowable temperature difference ΔT according to the relationships L1, L2, L3 shown in FIG. 5 in the same way as in the second invention, so that the introduction of the dislocations into the seed crystal 14 can be prevented without raising the temperature of the seed crystal 14 more than necessary, and the seed crystal 14 is prevented from melting before it is immersed in the melt 5. And, a heat load on the quartz crucible 3 can also be decreased. Besides, if the diameter D of the seed crystal 14 is same, the allowable temperature difference ΔT can be increased by increasing the concentration of the impurity (e.g., boron B) in the seed crystal 14 in the same way as in the second invention, so that the introduction of the dislocations can be prevented while suppressing the rise of the temperature of the seed crystal 14 to a smaller level.

Besides, according to the fifth invention, the sixth invention and the seventh invention, the main heater 9 is disposed on the side of the quartz crucible 3, and the auxiliary heater (bottom heater) 19 is disposed at the bottom of the quartz crucible 3 as shown in FIG. 1, and the outputs of the heaters 9, 19 are controlled separately. The main heater 9 and the auxiliary heater 19 are generally disposed for the single crystal pulling apparatus 1 for producing the large-diameter and heavy single crystal silicon ingot 6 in order to prevent the melt 5 from solidifying on the bottom of the crucible 3 and to control the distribution of the oxygen concentration in the single crystal silicon 6. Outputs of the main heater 9 and the auxiliary heater 19 are controlled so that the temperature of the melt 5 becomes a target temperature.

At the time when the seed crystal 14 is immersed in the melt 5, the output of the auxiliary heater 19 is turned off (0 kW) as shown in FIG. 6. Thus, the output of the main heater 9 is raised in order to keep the temperature of the melt 5 at a target temperature. Therefore, the temperature of the seed crystal 14 is raised, and the temperature difference between the seed crystal 14 and the melt 5 is adjusted to fall within the allowable temperature difference ΔT determined from the relationships shown in FIG. 5.

According to the fifth invention, the sixth invention and the seventh invention, the heaters 9, 19 generally provided for the existing single crystal pulling apparatus 1 can be used as they are, and it is not necessary to add a new heating device or the like for heating the seed crystal 14 only, so that the number of parts can be prevented from increasing, and the apparatus cost can be reduced.

And also, only the temperature of the seed crystal 14 is raised, and the temperature of the melt 5 is not influenced.

An eighth invention is an apparatus for producing a single-crystal semiconductor by immersing a seed crystal in a melt and pulling the seed crystal, wherein:

a relationship between an allowable temperature difference and a diameter of the seed crystal is previously determined so that a temperature difference between the seed crystal and the melt at the time the seed crystal is immersed in the melt falls within the allowable temperature difference at which dislocations are not introduced into the seed crystal;

the allowable temperature difference corresponding to the diameter of the seed crystal to be immersed in the melt is determined according to the relationship; and a heat reflector is disposed near the seed crystal so that the temperature difference between the seed crystal and the melt falls within the determined allowable temperature difference at the time the seed crystal is immersed in the melt.

A ninth invention is an apparatus for producing a single-crystal semiconductor by heating a melt in a crucible, immersing a seed crystal having an impurity added therein in the melt, and pulling the seed crystal, comprising:

a plurality of heating units which are disposed outside of the crucible to adjust independently an amount of heat applied to the crucible, wherein:

a relationship among an allowable temperature difference, a diameter of the seed crystal and a concentration of the impurity in the seed crystal is previously determined so that a temperature difference between the seed crystal and the melt at the time the seed crystal is immersed in the melt falls within the allowable temperature difference at which dislocations are not introduced into the seed crystal;

the allowable temperature difference corresponding to the diameter of the seed crystal to be immersed in the melt and the concentration of the impurity in the seed crystal is determined according to the relationship; and a heat reflector is disposed near the seed crystal so that the temperature difference between the seed crystal and the melt falls within the determined allowable temperature difference at the time the seed crystal is immersed in the melt.

According to the eighth invention, the temperature difference between the seed crystal 14 and the melt 5 is controlled in the same way as in the first invention to fall within the allowable temperature difference ΔT according to the relationships L1, L2, L3 shown in FIG. 5, so that the introduction of the dislocations into the seed crystal 14 can be prevented without raising the temperature of the seed crystal 14 more than necessary, and the seed crystal 14 is prevented from melting before it is immersed in the melt 5. And, a heat load on the quartz crucible 3 can be reduced.

According to the ninth invention, the temperature difference between the seed crystal 14 and the melt 5 is controlled in the same way as in the second invention to fall within the allowable temperature difference ΔT according to the relationships L1, L2, L3 shown in FIG. 5, so that the introduction of the dislocations into the seed crystal 14 can be prevented without raising the temperature of the seed crystal 14 more than necessary, and the seed crystal 14 is prevented from melting before it is immersed in the melt 5. And, a heat load on the quartz crucible 3 can be reduced. Besides, if the diameter D of the seed crystal 14 is same, the allowable temperature difference ΔT can be increased by increasing the concentration of the impurity (e.g., boron B) in the seed crystal 14 in the same way as in the second invention, so that the introduction of the dislocations can be prevented while suppressing the increase in the temperature of the seed crystal 14 to a smaller level.

According to the eighth invention and the ninth invention, a heat reflector 4d is mounted near the seed crystal 14 as shown in FIG. 3, and radiant heat from the melt 5 and the heater 9 is collectively given to the seed crystal 14 by the heat reflector 4d, and radiation from the seed crystal 14 is suppressed, so that the temperature of the seed crystal 14 only is increased, and there is not much effect on a change in temperature of the melt 5.

BRIEF DESCRIPTION OF THE DRAWINGS

FIG. 7 is a diagram showing a state that the temperature at the leading end of the seed crystal changes depending on a reflector width.

BEST MODE FOR CARRYING OUT THE INVENTION

The apparatus of embodiments will be described with reference to the drawings.

Figure 1:
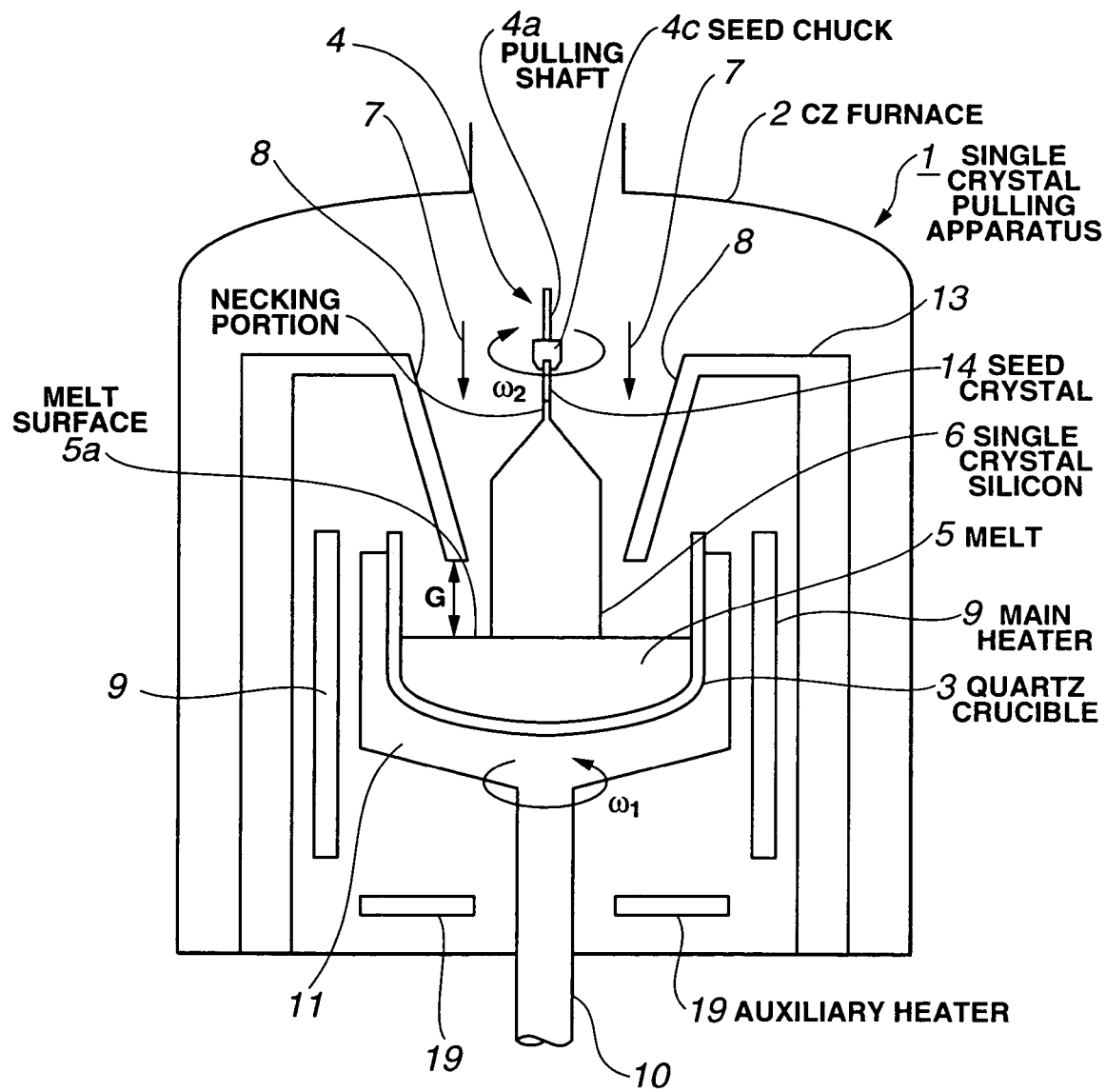
FIG. 1 is a diagram showing a single crystal pulling apparatus according to an embodiment.

FIG. 1 is a diagram showing a side of the structure of an embodiment.

As shown in FIG. 1, a single crystal pulling apparatus 1 according to the embodiment is provided with a CZ furnace (chamber) 2 as a single-crystal pulling vessel. The single crystal pulling apparatus 1 of FIG. 1 is an apparatus suitable for production of a large-diameter and heavy single crystal silicon ingot 6.

A quartz crucible 3 for melting a starting material of polycrystalline silicon and keeping in as melt 5 is disposed within the CZ furnace 2. The quartz crucible 3 is covered with a graphite crucible 11. A main heater 9 which heats to melt the polycrystalline silicon material within the quartz crucible 3 is disposed outside of and next to the quartz crucible 3. An auxiliary heater (bottom heater) 19 which supplementarily heats the bottom of the quartz crucible to prevent the melt 5 from solidifying on the bottom of the quartz crucible 3 is disposed below the quartz crucible 3. Outputs (power; kW) of the main heater 9 and the auxiliary heater 19 are controlled independently, and the amounts of heat applied to the melt 5 are adjusted independently. For example, after a temperature of the melt 5 is detected, the detected temperature is used as a feedback amount, and the individual outputs of the main heater 9 and the auxiliary heater 10 are controlled so that the temperature of the melt 5 is determined as a target temperature.

In the embodiment, the melt 5 is externally heated by the heaters 9, 19, but the heating devices are not limited to the heaters, but any heating devices may be used. For example, an induction heating method or heating by laser irradiation may be used.

A thermal insulator 13 is disposed between the main heater 9 and the inside wall of the CZ furnace 2.

A pulling mechanism 4 is disposed above the quartz crucible 3. The pulling mechanism 4 includes a pulling shaft 4a and a seed chuck 4c at a leading end of the pulling shaft 4a. The seed crystal 14 is held by the seed chuck 4c.

Polycrystalline silicon (Si) is heated to melt in the quartz crucible 3. When the melt 5 has a stabilized temperature, the pulling mechanism 4 operates to pull the single crystal silicon (single crystal silicon ingot) 6 from the melt 5. Specifically, the pulling shaft 4a is lowered, and the seed crystal 14 held by the seed chuck 4c at the leading end of the pulling shaft 4a is immersed into the melt 5. After the seed crystal 14 is familiarized in the melt 5, the pulling shaft 4a is lifted. The single crystal silicon 6 grows as the seed crystal 14 held by the seed chuck 4c is lifted. When pulling up, the quartz crucible 3 is rotated at the number of rotations $\omega 1$ by a rotating shaft 10. The pulling shaft 4a of the pulling mechanism 4 rotates at the number of rotations $\omega 2$ in an opposite direction or the same direction as that of the rotating shaft 10.

The rotating shaft 10 can be driven in a vertical direction and can vertically move the quartz crucible 3 to a desired position.

The interior of the CZ furnace 2 is maintained vacuum (e.g., about 20 Torr) by shielding the interior of the furnace 2 from outside air. Namely, argon gas 7 is supplied as an inert gas to the CZ furnace 2 and pumped out through an exhaust opening of the CZ furnace 2. Thus, the interior of the furnace 2 is decompressed to a prescribed pressure.

During the single crystal pulling process (1 batch), various vaporized materials are produced in the CZ furnace 2. Therefore, the CZ furnace 2 is cleaned by supplying the argon gas 7 to the CZ furnace 2 and discharging it together with the vaporized materials out of the CZ furnace 2 to remove the vaporized materials from the interior of the CZ furnace 2. A supply flow rate of the argon gas 7 is determined for each step in the single batch.

The melt 5 decreases as the single crystal silicon 6 is pulled up. A contact area between the melt 5 and the quartz crucible 3 changes as the melt 5 decreases, and the quantity of dissolved oxygen from the quartz crucible 3 changes. This change affects on the distribution of oxygen concentration in the single crystal silicon 6 being pulled. To prevent it, the polycrystalline silicon material or the single crystal silicon material may be further supplied into the quartz crucible 3, in which the melt 5 has decreased, after or during pulling.

A nearly inverted truncated cone heat shielding plate 8 (gas rectifying cylinder) is disposed above the quartz crucible 3 and around the single crystal silicon 6. The heat shielding plate 8 is supported by the thermal insulator 13. The heat shielding plate 8 guides the argon gas 7, which is supplied as the carrier gas from above into the CZ furnace 2, to the center of the melt surface 5a, allows to pass through the melt surface 5a and guides to the peripheral portion of the melt surface 5a. And, the argon gas 7 is discharged together with the gas evaporated from the melt 5 through an exhaust vent formed at a lower part of the CZ furnace 2. Therefore, a gas flow rate on the melt surface can be stabilized, and oxygen evaporated from the melt 5 can be kept in a stable state.

The heat shielding plate 8 insulates and shields the seed crystal 14 and the single crystal silicon 6 grown by the seed crystal 14 from radiant heat generated from the high-temperature portions such as the quartz crucible 3, the melt 5 and the main heater 9. The heat shielding plate 8 prevents that the impurity (e.g., silicon oxide) and the like generated within the furnace adhere to the single crystal silicon 6 to impair the growth of the single crystal. The gap G between the bottom end of the heat shielding plate 8 and the melt surface 5a can be adjusted by vertically moving the rotating shaft 10 to change the vertical position of the quartz crucible 3. And, the gap G may be adjusted by vertically moving the heat shielding plate 8 by an elevator.

Figure 2:
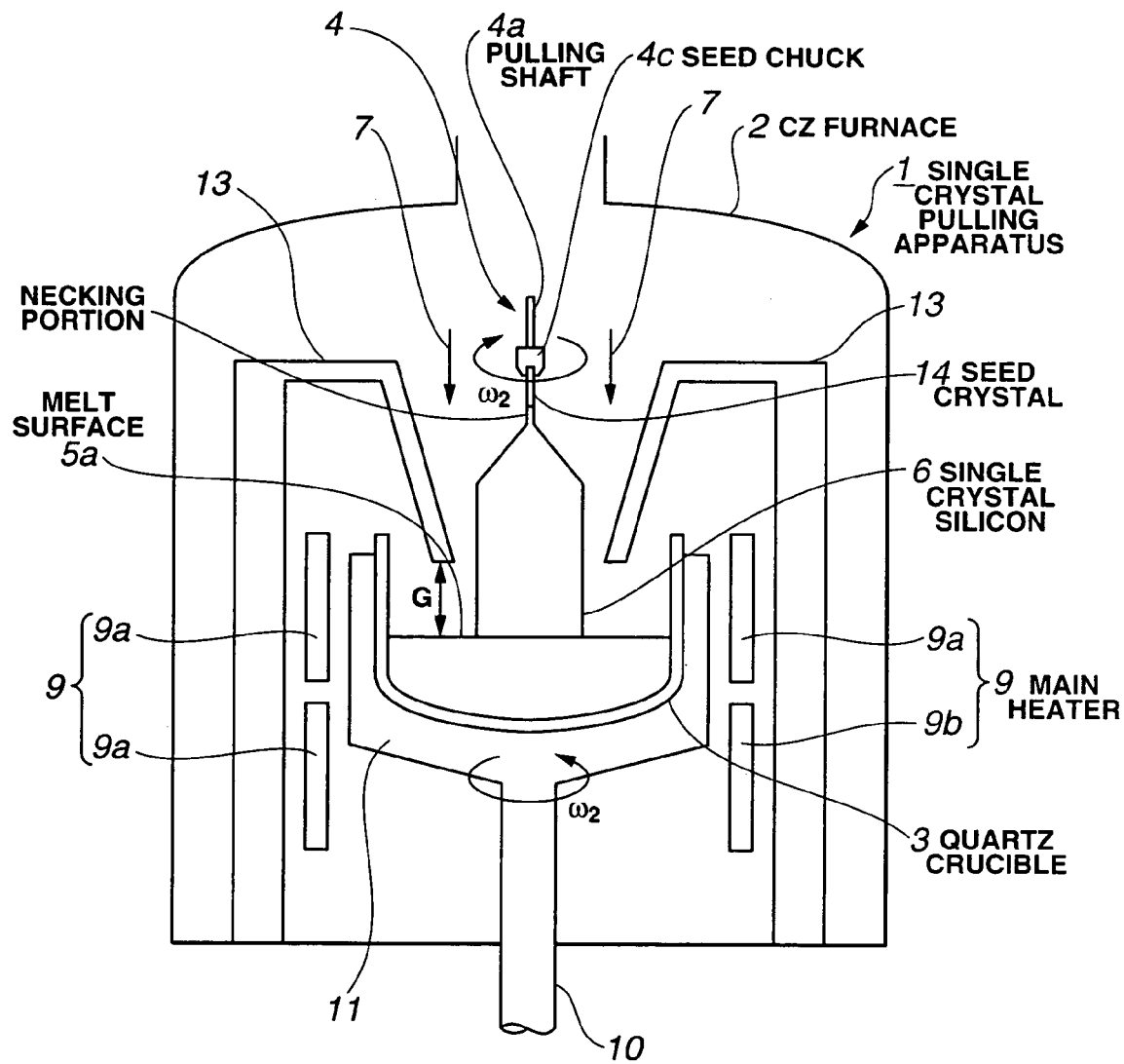
FIG. 2 is a diagram showing a single crystal pulling apparatus different from the one shown in FIG. 1.

The single-crystal pulling apparatus 1 shown in FIG. 2 may be used instead of the single-crystal pulling apparatus 1 of FIG. 1.

In the apparatus shown in FIG. 2, the auxiliary heater 19 is omitted, and the main heater 9 is divided into two-stage upper and lower heaters 9a, 9b along the vertical direction of the quartz crucible 3. The heaters 9a, 9b can independently adjust an amount of heat applied, namely output, to the quartz crucible 3. By adjusting a ratio of output of the upper heater 9a and the lower heater 9b, the melt 5 is prevented from solidifying on the bottom of the quartz crucible 3, and the distribution of an oxygen concentration in the pulled single crystal silicon 6 is controlled. According to the apparatus of the embodiment, the heater 9 is divided into two stages but may be divided into three or more.

FIRST EXAMPLE

Figure 5:
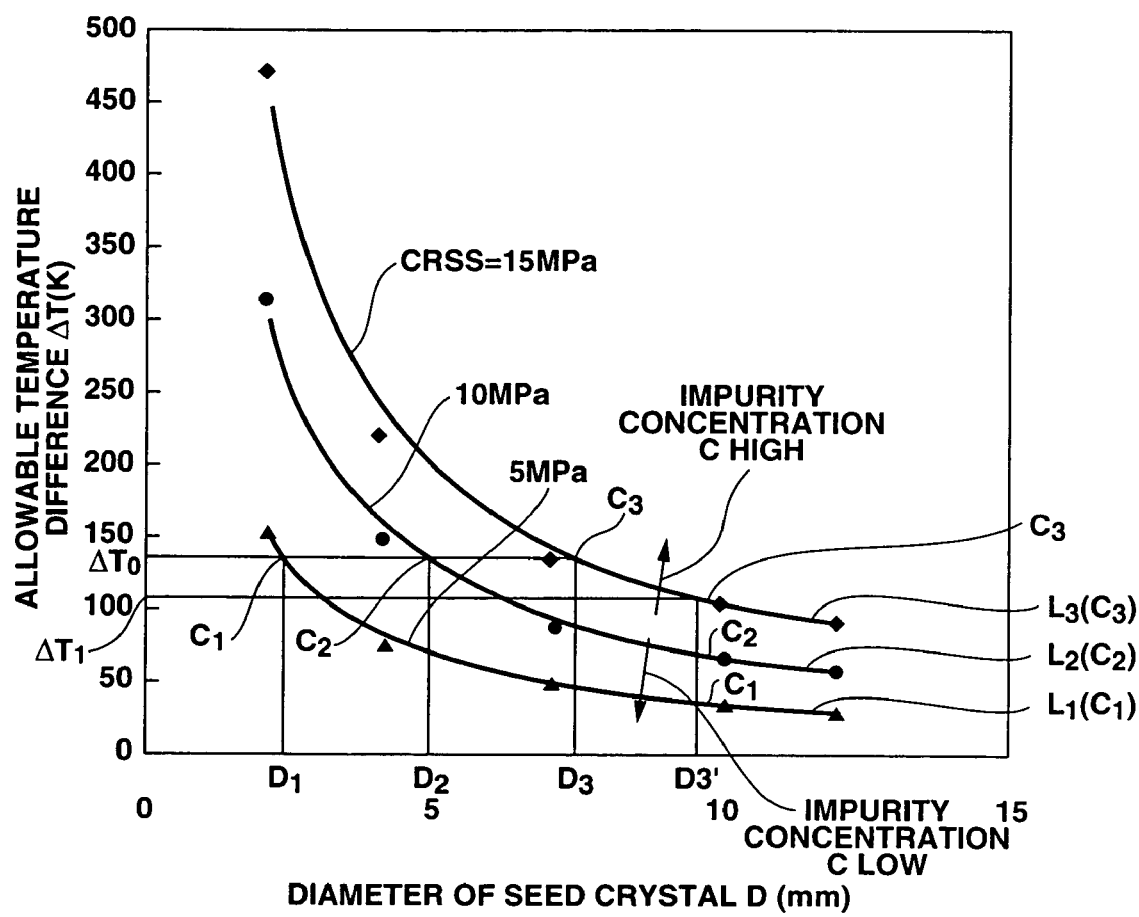
FIG. 5 is a diagram showing a relationship between a diameter of a seed crystal and an allowable temperature difference.

FIG. 5 shows the relationships between a diameter D and an allowable temperature difference $\Delta T$ as characteristics L1, L2, L3, wherein the horizontal axis represents the diameter D (mm) of the seed crystal 14, and the vertical axis represents the allowable temperature difference $\Delta T$ (K) between a temperature at the leading end of the seed crystal 14 and a temperature of the melt 5 at the time the seed crystal is immersed in the melt. The characteristics L1, L2, L3 show that the seed crystal diameter D and the allowable temperature difference $\Delta T$ are substantially inversely proportional to each other. In other words, a thermal shock stress applied to the seed crystal 14 when it is immersed in the melt increases as the seed crystal diameter D becomes large, and it is necessary to decrease the allowable temperature difference $\Delta T$ accordingly.

The allowable temperature difference $\Delta T$ is an upper limit temperature difference at which dislocations are not introduced into the seed crystal 14.

The characteristics L1, L2, L3 represent a difference in magnitude of a critical resolved shear stress (CRSS; MPa) which is one of indexes for a mechanical strength of the seed crystal 14. The critical resolved shear stress (CRSS) is a critical stress that dislocations are introduced into the seed crystal 14 when this stress is exceeded. In the figure, the characteristic L1 represents that the critical resolved shear stress (CRSS) is minimum (5 MPa), the characteristic L2 represents that the critical resolved shear stress (CRSS) is larger (10 MPa) than the characteristic L1, and the characteristic L3 represents that the critical resolved shear stress (CRSS) is maximum (15 MPa).

The critical resolved shear stress (CRSS) is variable depending on a type and a concentration C of the impurity added to the seed crystal 14. It is assumed in this example that boron B is used as a kind of impurity.

The critical resolved shear stress (CRSS) becomes large as the concentration C of the impurity added to the seed crystal 14 becomes high. The characteristics changes as indicated by L1, L2 and L3 as the concentration C of the impurity added to the seed crystal 14 becomes high as indicated by C1, C2 and C3. In FIG. 5, typical three cases of the impurity concentration C are shown, and when the concentration C of the impurity changes more gradually and continuously, the characteristics are changed gradually or continuously in correspondence therewith.

Therefore, if the diameter D of the seed crystal 14 has, for example, the same value D'3, the characteristic changes as indicated by L1, L2, L3 as the impurity concentration C becomes high as indicated by C1, C2 and C3, so that the allowable temperature difference $\Delta T$ becomes large. If the allowable temperature difference $\Delta T$ has the same value $\Delta T0$, the characteristic changes as indicated by L1, L2, L3 as the diameter D of the seed crystal 14 becomes large as indicated by D1, D2, D3. Therefore, the impurity concentration C is advisably increased as indicated by C1, C2, C3.

The boron B was used as a kind of the impurity in the above description, but the same relationship is also established when various kinds of impurities such as germanium Ge and indium In other than the boron B are added to the seed crystal 14.

A procedure of controlling the individual outputs of the main heater 9 and the auxiliary heater 19 shown in FIG. 1 will be described with reference to the relationship shown in FIG. 5.

First, the characteristic corresponding to the concentration C of the impurity added to the seed crystal 5 is selected from the characteristics L1, L2, L3 shown in FIG. 5. For example, when the impurity concentration C is C3, the characteristic L3 is selected. Then, the allowable temperature difference $\Delta T$ corresponding to the diameter D of the seed crystal 5 is determined from the selected characteristic L3. For example, when the diameter D of the seed crystal 5 is D'3, the allowable temperature difference $\Delta T1$ is determined from a corresponding point on the characteristic L3. The diameter D'3 of the seed crystal 5 can be determined as a size which can be held by a necking portion only without a disadvantage such as falling due to breakage or without using a holding device or the like when a large-diameter and heavy single crystal silicon ingot 6 is being pulled or while it is cooled after pulling up and then removed.

Figure 4:
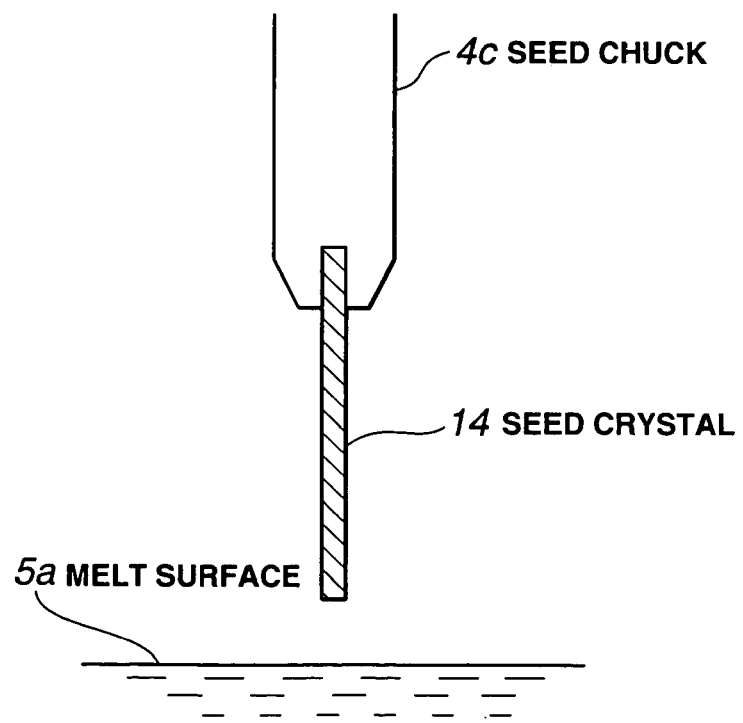
FIG. 4 is a diagram showing a state before a seed crystal is immersed in melt.

FIG. 4 shows a state before the seed crystal 14 is immersed in the melt 5. Just before the seed crystal 14 held by the seed chuck 4c is immersed in the melt 5, the pulling shaft 4a is stopped from lowering, and a distance between the leading end of the seed crystal 14 and the melt surface 5a is kept to a prescribed distance, e.g., 10 mm.

Then, the output of the auxiliary heater 19 is turned off (0 kW).

Figure 6:
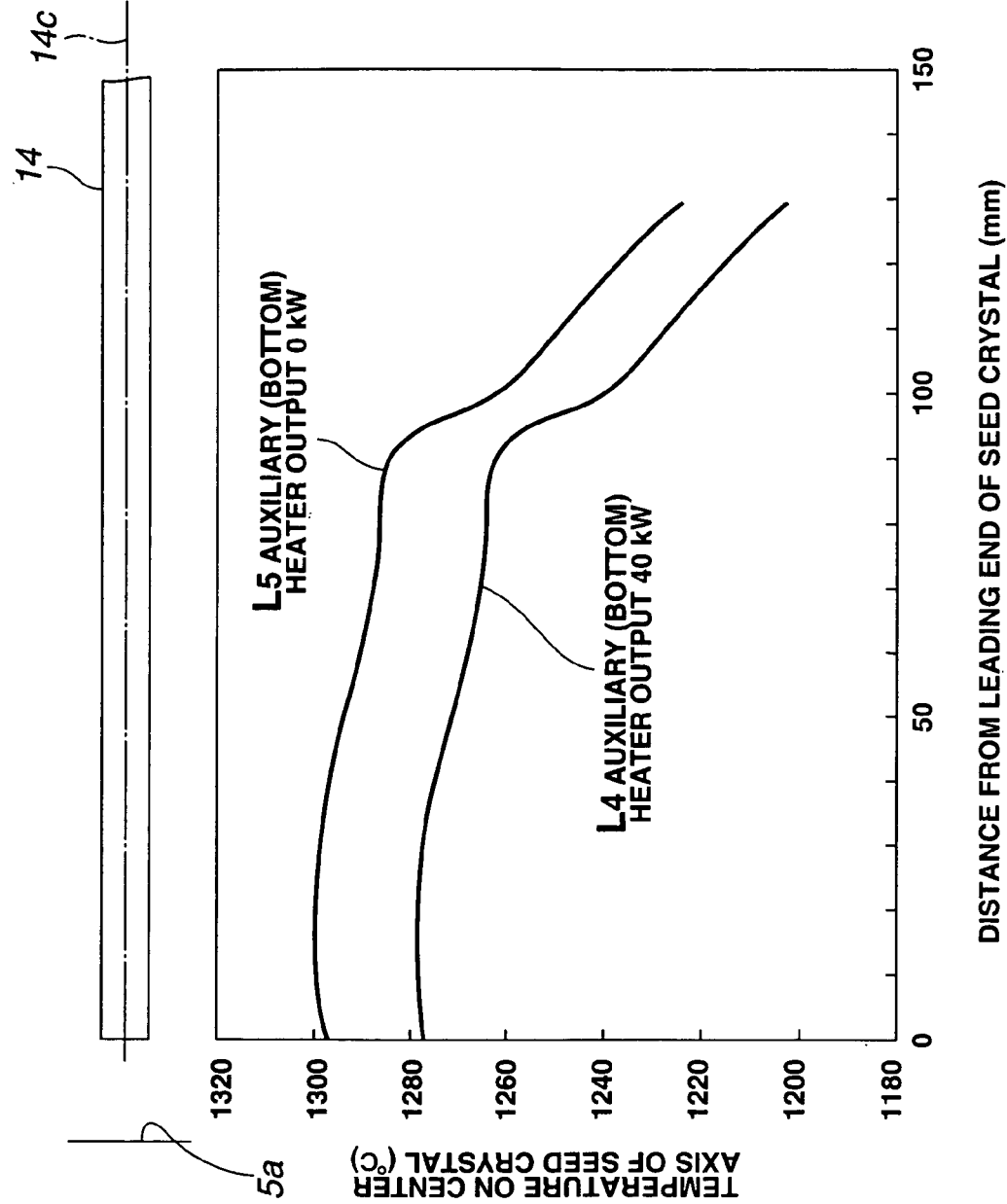
FIG. 6 is a diagram showing a relationship between a distance from a leading end of a seed crystal and a temperature on the central axis of the seed crystal.

FIG. 6 compares a temperature distribution L4 of individual portions of the seed crystal 14 when the output of the auxiliary heater 19 is maintained at normal 40 kW and a temperature distribution L5 of individual portions of the seed crystal 14 when the output of the auxiliary heater 19 is turned off (0 kW), wherein the horizontal axis represents a distance on a center axis c from the leading end of the seed crystal 14 to the individual portions of the seed crystal 14, and the vertical axis represents a temperature on a center axis 14c of the seed crystal 14. FIG. 6 shows the temperature distributions L4, L5 when the distance between the leading end of the seed crystal 14 and the melt surface 5a is kept to 10 mm.

As shown in FIG. 6, when the output of the auxiliary heater 19 is switched from 40 kW to off (0 kW), the output of the main heater 9 increases in order to keep the temperature of the melt 5 at a target temperature. Therefore, a larger amount of radiant heat is given to the seed crystal 14 by the increased output of the main heater 9, and consequently the temperature of the seed crystal 14 is increased. Therefore, the temperatures of the individual portions along the center axis 14c of the seed crystal 14 increase, and the temperature distribution changes from L4 to L5. Then, the temperature difference between the temperature at the leading end of the seed crystal 14 and the temperature of the melt 5 is adjusted to the allowable temperature difference ΔT1 determined from the relationship shown in FIG. 5. For example, the temperature of the seed crystal 14 is detected by a thermocouple covered with a protective tube or by disposing a heat-resistant member such as a carbon ball at the position of the leading end of the seed crystal above the melt 5 and measuring its temperature by a radiation thermometer, while the temperature of the melt 5 is also detected. As the temperature sensor for the melt 5, a conventional sensor used to control the outputs of the heaters 9, 19 can be used. And, the temperature difference between the detected temperature of the seed crystal 14 and the detected temperature of the melt 5 is determined as an actual temperature difference ΔT. Otherwise, the temperature of the leading end of the seed crystal 14 and the temperature of the melt 5 may be calculated by a computer simulation to determine the actual temperature difference ΔT. In this case, it is necessary to check in advance that the value determined by the simulation and the actual temperature difference ΔT agree to each other in a range not involving any problem in practice. Thus, it is judged whether the actual temperature difference ΔT measured has reached the allowable temperature difference ΔT1.

The auxiliary heater 19 is off in FIG. 6 but may be lowered to a level lower than the ordinary output (40 kW). In this case, with the difference between the measured actual temperature difference ΔT and the allowable temperature difference ΔT1 used as the feedback amount, a reduced amount of output of the auxiliary heater 19 is controlled so that the allowable temperature difference ΔT1 determined from the relationship shown in FIG. 5 can be obtained as a target value.

If the temperature difference between the temperature at the leading end of the seed crystal 14 before it is immersed in the melt and the temperature of the melt 5 agrees with the allowable temperature difference ΔT1 determined from the relationship shown in FIG. 5, the pulling shaft 4a is lowered to immerse the seed crystal 14 into the melt 5. After the seed crystal 14 is familiarized with the melt 5, the pulling shaft 4a is raised. The single crystal silicon 6 grows as the seed crystal 14 held by the seed chuck 4c is raised. In this case, the single crystal silicon ingot 6 is produced through a shoulder forming process, a body forming process and a tailing process without applying a necking process, namely without performing a process for making the seed crystal 14 diameter smaller.

According to this example as described above, critical numerical values of the allowable temperature difference ΔT for not introducing dislocations into the seed crystal 14 are previously determined apparently as the characteristics L1, L2, L3, the allowable temperature difference ΔT1 is determined according to the characteristics L1, L2, L3, and the individual outputs of the main heater 9 and the auxiliary heater 19 are controlled so that the allowable temperature difference ΔT1 can be obtained. Therefore, the introduction of dislocations into the seed crystal 14 can be prevented without decreasing the temperature difference ΔT to a level more than necessary, namely without raising the temperature of the seed crystal 14 to a value of over-specification. Thus, the seed crystal 14 can be prevented from melting before it is immersed in the melt 5, and the diameter of the seed crystal 14 before it is immersed in the melt can be prevented from decreasing. And a heat load on the quartz crucible 3 can be decreased.

As shown in FIG. 5, when the diameter D of the seed crystal 14 has a value D'3, the allowable temperature difference ΔT1 can be increased by increasing the concentration C of the impurity (e.g., boron B) in the seed crystal 14. Therefore, the introduction of dislocations can be prevented by increasing the concentration of the impurity in the seed crystal 14 to suppress the increase of the temperature of the seed crystal 14 to a lower level.

In this example, the heaters 9, 19 which are normally provided for the conventional single crystal pulling apparatus 1 can be used as they are, and it is not necessary to add a new heating device or the like only to heat the seed crystal 14, so that the number of parts can be suppressed from increasing and the apparatus cost can be reduced.

SECOND EXAMPLE

In the first example described above, the introduction of dislocations was prevented by controlling to turn off or to decrease the output of the auxiliary heater 19. Instead of controlling as above, the introduction of dislocations may be prevented by adjusting the concentration C of the impurity of the seed crystal 14.

Specifically, when the temperature difference between the temperature of the leading end of the seed crystal 14 and the temperature of the melt 5 is ΔT0 as shown in FIG. 5, the diameter D of the seed crystal 14 can be increased as indicated by D1, D2, D3 by increasing the impurity concentration C in the seed crystal 14 as indicated by C1, C2, C3.

Therefore, the characteristic L3 corresponding to the temperature difference ΔT0 and the diameter D3 of the seed crystal 5 is selected from the characteristics L1, L2, L3 shown in FIG. 5. Here, the temperature difference ΔT0 is a temperature difference between the temperature of the leading end of the seed crystal 14 and the temperature of the melt 5 when the output of the auxiliary heater 19 is kept at, for example, normal 40 kW as shown in FIG. 6. The diameter D3 of the seed crystal 14 is determined as a size which can be held by a necking portion only without a disadvantage such as falling due to breakage or without using a holding device or the like when a large-diameter and heavy single crystal silicon ingot 6 is being pulled or while it is cooled after pulling up and withdrawn from the furnace.

Then, the impurity is added to the seed crystal 14 so that the impurity concentration C in the seed crystal 14 becomes impurity concentration C3 corresponding to the selected characteristic L3.

The seed crystal 14 to which the impurity of the concentration C3 was added is used to pull up the single crystal silicon 6 by the ordinary CZ method.

According to this example, the introduction of dislocations into the seed crystal 14 at the time the seed crystal is immersed in the melt can be prevented, and a large-diameter and heavy single crystal silicon ingot 6 can be pulled up by adjusting the impurity concentration C of the seed crystal 14 without controlling the temperature difference ΔT.

THIRD EXAMPLE

The first example was described on the structure of the apparatus shown in FIG. 1, but the control contents of the first example may be applied to the apparatus structure shown in FIG. 2.

In this case, an upper heater 9a and a lower heater 9b shown in FIG. 2 are used instead of the side heater 9 and the bottom heater 19 shown in FIG. 1, and the same control as in the first example is executed. Specifically, the output of the upper heater 9a is increased to raise the temperature of the seed crystal 14 by controlling to turn off or decrease the output of the lower heater 9b so to adjust the temperature difference ΔT between the temperature of the leading end of the seed crystal 14 and the melt 5 to the allowable temperature difference ΔT1 determined from the relationship shown in FIG. 5.

FOURTH EXAMPLE

In the first example and the third example, the individual outputs of the plural heaters are controlled to adjust to the allowable temperature difference ΔT1 determined from the relationship shown in FIG. 5. When the single crystal pulling apparatus 1 shown in FIG. 1 is an apparatus for pulling the single crystal silicon 6 by using a magnetic field applied CZ method, a magnetic field applied to the melt 5 may be controlled to adjust to the allowable temperature difference ΔT1 determined from the relationship shown in FIG. 5.

Specifically, it is known by those skilled in the art that oxygen concentration taken into the single crystal silicon 6 is affected by the convection caused in the melt 5. As a technique of suppressing the convection in the quartz crucible 3, there is a technique called the magnetic field applied CZ method. This is a method of growing a crystal stably by applying a magnetic field to the melt 5 to suppress the convection in the melt 5.

As shown in FIG. 4, the convection in the melt 5 is suppressed by applying the magnetic field to the melt 5 in a state before the seed crystal 14 is immersed in the melt 5. Therefore, heat transfer in the melt 5 is suppressed, and the temperature of the melt 5 lowers, so that the output of the main heater 9 increases in order to keep the temperature of the melt 5 at a target temperature. As a result, the temperature of the leading end of the seed crystal 14 rises in the same way as in the first example, and the temperature difference between the temperature of the leading end of the seed crystal and the temperature of the melt is adjusted to the allowable temperature difference ΔT1 determined from the relationship shown in FIG. 5.

FIFTH EXAMPLE

In the first example and the third example, the outputs of the heating devices are controlled to adjust the temperature difference so to agree with the allowable temperature difference ΔT1 determined from the relationship shown in FIG. 5 but may be adjusted to be less than the allowable temperature difference ΔT1.

If controlling of the outputs of the heating devices does not make the temperature difference to be not more than the allowable temperature difference ΔT1 determined from the relationship shown in FIG. 5, other various conditions can be changed to adjust the temperature difference to be not more than the allowable temperature difference ΔT1. For example, if simple turning off of the auxiliary heater 19 does not make the temperature difference to be not more than the allowable temperature difference ΔT1, a magnetic field can be applied to the melt 5 as described above to adjust the temperature difference to be not more than the allowable temperature difference ΔT1. And, the quartz crucible 3 is lowered to increase the gap G so to efficiently conduct radiant heat from the main heater 9 to the seed crystal 14, thereby enabling to adjust the temperature difference to be not more than the allowable temperature difference ΔT1. And, the number of rotations ω1 of the rotating shaft 10 and the number of rotations ω2 of the pulling shaft 4a can be changed (by stopping the turning of the rotating shaft 10 and the pulling shaft 4a) to adjust the temperature difference to be not more than the allowable temperature difference ΔT1.

But, when the seed crystal 14 is immersed in the melt 5 and pulled up as the single crystal silicon 6, it is desirable that the changed various conditions are restored to the values suitable for pulling.

SIXTH EXAMPLE

Figure 3:
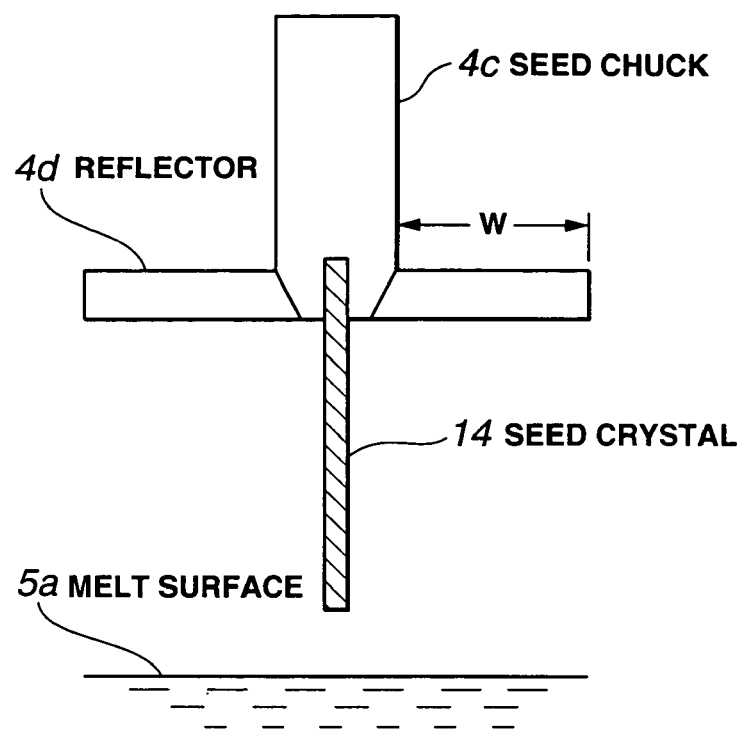
FIG. 3 is a diagram showing an example of mounting a reflector.

In the first and second examples, the outputs of the heating devices are controlled to adjust the temperature difference to the allowable temperature difference ΔT, but the reflector 4d for reflecting heat may be disposed near the seed crystal 14 as shown in FIG. 3 to adjust the temperature difference to the allowable temperature difference ΔT by the reflector 4d.

FIG. 3 shows a state before the seed crystal 14 is immersed in the melt 5. The seed chuck 4c is provided with the reflector 4d which reflects the radiant heat generated from the high-temperature portions such as the quartz crucible 3, the melt 5 and the main heater 9 to apply collectively to the seed crystal 14 and suppresses the radiation from the seed crystal 14. As a material for the reflector 4d, a material having high strength and high insulation efficiency, such as a carbon composite material, is used. And, it is also desirable to use a material having high strength and high insulation efficiency, such as a carbon composite material, as a material for the seed chuck 4c.

The amount of heat applied to the seed crystal 14, namely the temperature of the leading end of the seed crystal 14, is considered to increase in accordance with a width 2 W of the reflector 4d.

FIG. 7 shows a simulated result indicating that the temperature of a leading end 14a of the seed crystal 14 changes according to a size of the width 2 W of the reflector 4d. FIG. 7 shows a case that the distance between the leading end of the seed crystal 14 and the melt surface 5a is kept at a prescribed distance, e.g., 10 mm.

In FIG. 7, Al represents that the reflector 4d is not attached to the seed chuck 4c, and it is seen that the temperature of the leading end 14a of the seed crystal 14 is lowest. A2 represents that a small reflector 4'd having a width 2 W is attached to the seed chuck 4c, and it is seen that the temperature of the leading end 14a of the seed crystal 14 is higher than A1. And, A3 represents that a reflector 4d having a width 2 W larger than A2 is attached to the seed chuck 4c, and it is seen that the temperature of the leading end 14a of the seed crystal 14 is highest.

From the simulated results, the reflector 4d having the width 2 W is produced, which raises the temperature of the leading end of the seed crystal 14 to make the temperature difference between the temperature of the leading end of the seed crystal, and the temperature of the melt to be the allowable temperature difference ΔT1 determined from the relationship shown in FIG. 5 and attached to the seed chuck 4c.

Then, as shown in FIG. 3, the pulling shaft 4a is stopped from lowering just before the seed crystal 14 held by the seed chuck 4c is immersed in the melt 5 to keep the distance between the leading end of the seed crystal 14 and the melt surface 5a at a prescribed distance, e.g., 10 mm.

Therefore, the temperature of the leading end of the seed crystal 14 is raised by the reflector 4*d*, and the temperature difference between the temperature of the leading end of the seed crystal 14 and the temperature of the melt 5 agrees with the allowable temperature difference ΔT1 determined from the relationship shown in FIG. 5. The agreement with the allowable temperature difference ΔT1 may be detected by a temperature sensor such as a thermocouple, and it may be assumed that the agreement with the allowable temperature difference ΔT1 has been achieved after a lapse of a prescribed time without detecting by the temperature sensor.

If the temperature difference between the temperature of the leading end of the seed crystal 14 before it is immersed in the melt and the temperature of the melt 5 agrees with the allowable temperature difference ΔT1 determined from the relationship shown in FIG. 5, the pulling shaft 4*a* is lowered to immerse the seed crystal 14 into the melt 5. After the seed crystal 14 is familiarized with the melt 5, the pulling shaft 4*a* is raised. The single crystal silicon 6 grows as the seed crystal 14 held by the seed chuck 4*c* is raised. In this case, the single crystal silicon ingot 6 is produced through a shoulder forming process, a body forming process and a tailing process without performing the necking process, namely without performing a process for making the seed crystal 14 diameter smaller.

The reflector 4*d* is attached to the seed chuck 4*c*, but its attaching position is arbitrary. And, it is suitable when attached to the neighborhood of the seed crystal 14 so that radiant heat from the heater 9 and the like is collectively given to the seed crystal 14, and thermal radiation from the seed crystal 14 can be suppressed.

And, a notch 4*e* may be formed in a part of the reflector 4*d* to visually check the leading end of the seed crystal 14 as shown in FIG. 8. A state of the seed crystal 14 before it is immersed in the melt and an immersed state can be visually observed through a view port formed in the CZ furnace 2 and the notch 4*e* of the reflector 4*d*.

As described above, according to this example, the radiant heat from the heater 9 and the like is collectively given to the seed crystal 14, and the thermal radiation from the seed crystal 14 is suppressed by the reflector 4*d* attached near the seed crystal 14, so that only the temperature of the seed crystal 14 increases, and there is not much effect on a change in temperature of the melt 5.

According to production of a silicon wafer (<100> axial crystal) with a {100} crystalline plane, a technique of removing a slip dislocation has been established. Namely, when the seed crystal is pulled up so to coincide a <100> crystal orientation to the axial direction of the seed crystal, the slip dislocations can be easily removed from the single crystal silicon by performing the necking process of gradually reducing the diameter of the single crystal silicon after the seed crystal is immersed in the melt.

But, where the silicon wafer (<110> axial crystal) with {110} crystalline plane is to be produced or where the pulling is performed in such a way that the <110> crystal orientation agrees with the axial direction of the seed crystal, it is found that the elimination of the slip dislocations is difficult, and a technique of removing the slip dislocations has not been established.

When the pulling is performed in such a way that the <110> crystal orientation agrees with the axial direction of the seed crystal, the dislocations tend to remain in the crystal center portion causing a defective semiconductor device even if the diameter of the single crystal silicon is considerably reduced in the necking process. The slip dislocations cannot be removed unless the diameter of the single crystal silicon is considerably reduced in comparison with the case of pulling the <100> axial crystal.

Therefore, where the single crystal silicon 6 of the <110> axial crystal is to be pulled, the above-described first to sixth examples—may be applied to pull it with the diameter having made large.

INDUSTRIAL APPLICABILITY

It is assumed in the above-described examples that the single crystal silicon is pulled up, but the single crystal to be pulled may be a semiconductor other than silicon.

The invention claimed is:

1. A process for producing a single-crystal semiconductor by immersing a seed crystal in a melt and pulling the seed crystal, comprising:
   previously setting a relationship between an allowable temperature difference and a diameter of the seed crystal so that a temperature difference between the seed crystal and the melt at the time the seed crystal is immersed in the melt falls within the allowable temperature difference at which dislocations are not introduced into the seed crystal;
   determining the allowable temperature difference corresponding to the diameter of the seed crystal to be immersed in the melt according to the relationship; and
   adjusting a temperature so that a temperature of the seed crystal at the time of immersion does not exceed 1380° C. and the temperature difference between the seed crystal and the melt falls within a range of the determined allowable temperature difference at the time the seed crystal is immersed in the melt.

2. The process for producing a single-crystal semiconductor according to claim 1, wherein the single-crystal semiconductor is grown without performing a necking process for gradually reducing the diameter of the single-crystal semiconductor, after the seed crystal is immersed in the melt.

3. A process for producing a single-crystal semiconductor by immersing a seed crystal having an impurity added therein in a melt and pulling the seed crystal, comprising:
   previously setting a relationship among an allowable temperature difference, a diameter of the seed crystal and a concentration of the impurity in the seed crystal so that a temperature difference between the seed crystal and the melt at the time the seed crystal is immersed in the melt falls within the allowable temperature difference at which dislocations are not introduced into the seed crystal;
   determining the allowable temperature difference corresponding to the diameter of the seed crystal to be immersed in the melt and the concentration of the impurity in the seed crystal according to the relationship; and
   adjusting a temperature so that a temperature of the seed crystal at the time of immersion does not exceed 1380° C. and the temperature difference between the seed crystal and the melt falls within a range of the determined allowable temperature difference at the time the seed crystal is immersed in the melt.

4. The process for producing a single-crystal semiconductor according to claim 3, wherein the single-crystal semiconductor is grown without performing a necking process for gradually reducing the diameter of the single-crystal semiconductor, after the seed crystal is immersed in the melt.

5. An apparatus for producing a single-crystal semiconductor by heating a melt in a crucible, immersing a seed crystal in the melt and pulling the seed crystal, comprising:

a plurality of heating units which are disposed outside of the crucible to adjust independently an amount of heat applied to the crucible, wherein:

a relationship between an allowable temperature difference and a diameter of the seed crystal is previously determined so that a temperature difference between the seed crystal and the melt at the time the seed crystal is immersed in the melt falls within the allowable temperature difference at which dislocations are not introduced into the seed crystal;

the allowable temperature difference corresponding to the diameter of the seed crystal to be immersed in the melt is determined according to the relationship; and individual amounts of heat applied by the plurality of heating units are controlled so that a temperature of the seed crystal at the time of immersion does not exceed 1380° C. and the temperature difference between the seed crystal and the melt falls within a range of the determined allowable temperature difference at the time the seed crystal is immersed in the melt.

6. The apparatus for producing a single-crystal semiconductor according to claim 5, wherein the plurality of heating units are heating units which are disposed vertically at individual positions outside of the crucible, and the temperature difference between the seed crystal and the melt at the time the seed crystal is immersed in the melt is set to the allowable temperature difference or below by decreasing or turning off an output of a heating unit disposed at a lower side.

7. An apparatus for producing a single-crystal semiconductor by heating a melt in a crucible, immersing a seed crystal having an impurity added therein in the melt, and pulling the seed crystal, comprising:

a plurality of heating units which are disposed outside of the crucible to adjust independently an amount of heat applied to the crucible, wherein:

a relationship among an allowable temperature difference, a diameter of the seed crystal and a concentration of the impurity in the seed crystal is previously determined so that a temperature difference between the seed crystal and the melt at the time the seed crystal is immersed in the melt falls within the allowable temperature difference at which dislocations are not introduced into the seed crystal;

the allowable temperature difference corresponding to the diameter of the seed crystal to be immersed in the melt and the concentration of the impurity in the seed crystal is determined according to the relationship; and individual amounts of heat applied by the plurality of heating units are controlled so that a temperature of the seed crystal at the time of immersion does not exceed 1380° C. and the temperature difference between the seed crystal and the melt falls within a range of the determined allowable temperature difference at the time the seed crystal is immersed in the melt.

8. The apparatus for producing a single-crystal semiconductor according to claim 7, wherein the plurality of heating units are heating units which are disposed vertically at individual positions outside of the crucible, and the temperature difference between the seed crystal and the melt at the time the seed crystal is immersed in the melt is set to the allowable temperature difference or below by decreasing or turning off an output of a heating unit disposed at a lower side.

9. An apparatus for producing a single-crystal semiconductor by immersing a seed crystal in a melt and pulling the seed crystal, wherein:

a relationship between an allowable temperature difference and a diameter of the seed crystal is previously determined so that a temperature difference between the seed crystal and the melt at the time the seed crystal is immersed in the melt falls within the allowable temperature difference at which dislocations are not introduced into the seed crystal;

the allowable temperature difference corresponding to the diameter of the seed crystal to be immersed in the melt is determined according to the relationship; and a heat reflector is disposed near the seed crystal so that the temperature difference between the seed crystal and the melt falls within the determined allowable temperature difference at the time the seed crystal is immersed in the melt.

10. An apparatus for producing a single-crystal semiconductor by heating a melt in a crucible, immersing a seed crystal having an impurity added therein in the melt, and pulling the seed crystal, comprising:

a plurality of heating units which are disposed outside of the crucible to adjust independently an amount of heat applied to the crucible, wherein:

a relationship among an allowable temperature difference, a diameter of the seed crystal and a concentration of the impurity in the seed crystal is previously determined so that a temperature difference between the seed crystal and the melt at the time the seed crystal is immersed in the melt falls within the allowable temperature difference at which dislocations are not introduced into the seed crystal;

the allowable temperature difference corresponding to the diameter of the seed crystal to be immersed in the melt and the concentration of the impurity in the seed crystal is determined according to the relationship; and a heat reflector is disposed near the seed crystal so that the temperature difference between the seed crystal and the melt falls within the determined allowable temperature difference at the time the seed crystal is immersed in the melt.

\* \* \* \* \*